(12) United States Patent
Lin et al.

(10) Patent No.: US 8,164,544 B2
(45) Date of Patent: Apr. 24, 2012

(54) PIXEL ARRAY LAYOUT

(75) Inventors: Chen-Wei Lin, Kaohsiung (TW); Yen-Shih Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 433 days.

(21) Appl. No.: 12/506,257

(22) Filed: Jul. 21, 2009

(65) Prior Publication Data

US 2010/0164844 A1 Jul. 1, 2010

(30) Foreign Application Priority Data

Dec. 30, 2008 (TW) .............................. 97151425 A

(51) Int. Cl.
*G09G 3/20* (2006.01)
(52) U.S. Cl. .......................................... 345/55; 345/90
(58) Field of Classification Search ................. 345/55, 345/82, 76, 87, 90
See application file for complete search history.

(56) References Cited

U.S. PATENT DOCUMENTS

| | | | |
|---|---|---|---|
| 4,701,808 A * | 10/1987 | Nagashima | 358/451 |
| 6,483,487 B2 * | 11/2002 | Iseki | 345/60 |
| 7,289,743 B2 * | 10/2007 | Kin et al. | 399/27 |
| 2002/0044106 A1 * | 4/2002 | Iseki | 345/60 |
| 2005/0017652 A1 * | 1/2005 | Kobayashi | 315/169.3 |
| 2005/0024295 A1 * | 2/2005 | Furutani | 345/60 |
| 2005/0169648 A1 * | 8/2005 | Kin et al. | 399/27 |
| 2008/0031644 A1 * | 2/2008 | Kin et al. | 399/27 |
| 2008/0049002 A1 * | 2/2008 | Lin et al. | 345/205 |

* cited by examiner

*Primary Examiner* — Ricardo L Osorio
(74) *Attorney, Agent, or Firm* — Jianq Chyun IP Office

(57) ABSTRACT

A pixel array layout includes a substrate, a plurality of scan lines disposed on the substrate, a plurality of data lines disposed on the substrate, a plurality of pixel units disposed on the substrate, and a pre-discharge conductive layer. Each of the pixel units is electrically connected to at least one of the scan lines and one of the data lines correspondingly, and each of the pixel units has a driving circuit and a pixel electrode electrically connected to the driving circuit. The pre-discharge conductive layer is electrically connected to the driving circuit and extends to an area between two adjacent pixel electrodes from an edge of the substrate, and the pre-discharge conductive layer and the pixel electrodes do not overlap.

17 Claims, 9 Drawing Sheets

US 8,164,544 B2

PIXEL ARRAY LAYOUT

CROSS-REFERENCE TO RELATED APPLICATION

This application claims the priority benefit of Taiwan application serial no. 97151425, filed Dec. 30, 2008. The entirety of the above-mentioned patent application is hereby incorporated by reference herein and made a part of specification.

BACKGROUND OF THE INVENTION

1. Field of the Invention

The present invention relates to a pixel array layout. More particularly, the present invention relates to a pixel array layout having a pre-discharge conductive layer.

2. Description of Related Art

Owing to diversity of information equipment, demands for flat panel displays (FPDs) are increased day by day. With the current market trend of compactness and low power consumption, cathode ray tube (CRT) displays have been gradually replaced by the FPDs. At present, the FPDs can be roughly categorized into plasma display panels (PDPs), liquid crystal displays (LCDs), vacuum fluorescent displays, field emission displays, electro-chromic displays, organic light-emitting displays (OLEDs), and so forth. In comparison with other FPD techniques, the OLEDs have a tremendous application potential to become the mainstream FPDs in the next generation due to various advantages including self-luminescence, no viewing-angle dependence, low power consumption, simple fabrication, low costs, low working temperature, high response speed, and full-color display.

Nowadays, organic light-emitting materials are already successfully applied to the FPDs, and the OLEDs can be divided into passive matrix OLEDs and active matrix OLEDs. Generally, the main difference between the passive matrix OLED and the active matrix OLED lies in that each pixel in the active matrix OLED has a storage capacitor for ensuring favorable display quality. Since active matrix OLED techniques are conducive to development of displays towards great dimension and high resolution, the active matrix OLED draws more attention than the passive matrix OLED does.

In a conventional active matrix OLED, a driving circuit in each pixel unit normally has a 2T1C structure, i.e., two transistors and one storage capacitor, so as to control a driving current flowing into each pixel unit. To stabilize the driving current, a 3T1C structure, i.e., three transistors and one storage capacitor, is adopted to form the driving circuit in the pixel unit according to the related art, as shown in FIG. 1.

FIG. 1 is a schematic view of a conventional driving circuit having the 3T1C structure. Referring to FIG. 1, the conventional driving circuit 100 having the 3T1C structure includes a switching transistor $TFT_1$, a driving transistor $TFT_2$, a pre-discharge transistor $TFT_3$, and a storage capacitor $C_{st}$. The switching transistor $TFT_1$ has a first gate $G_1$, a first source $S_1$, and a first drain $D_1$. The first gate $G_1$ is electrically connected to one scan line $SL_n$, and the first drain $D_1$ is electrically connected to one data line DL. The driving transistor $TFT_2$ has a second gate $G_2$, a second source $S_2$, and a second drain $D_2$. The second drain $D_2$ is electrically connected to a voltage or a current source $V_{DD}$, and the second source $S_2$ is electrically connected to a pixel electrode P. The pre-discharge transistor $TFT_3$ has a third gate $G_3$, a third source $S_3$, and a third drain $D_3$. The third gate $G_3$ is electrically connected to the preceding scan line $SL_{n-1}$, and the third source $S_3$ is electrically connected to a metal pre-discharge conductive layer 102. Besides, the storage capacitor $C_{st}$ has a first electrode $E_1$ and a second electrode $E_2$. The first electrode $E_1$, the first source $S_1$, the second gate $G_2$, and the third drain $D_3$ are electrically connected together, and the second electrode $E_2$ is electrically connected to the voltage source $V_{DD}$.

It can be learned from FIG. 1 that the switching transistor $TFT_1$ is used for an address operation and for determining the degree to which the driving transistor $TFT_2$ is turned on. Besides, the driving transistor $TFT_2$ controls the driving current passing through an organic light-emitting diode 104. The pre-discharge transistor $TFT_3$ is used for a pre-discharging operation, so as to avoid offset of a threshold voltage $V_{th}$. In detail, when a high voltage is input to the second scan line $SL_n$, the switching transistor $TFT_1$ connected to the second scan line $SL_n$ is turned on. Here, the data line DL can transmit image signals to the second gate $G_2$ of the driving transistor $TFT_2$ through the switching transistor $TFT_1$, so as to determine the degree to which the driving transistor $TFT_2$ is turned on. As such, the voltage source $V_{DD}$ is able to supply a current corresponding to the image signals to the organic light-emitting diode 104 through the driving transistor $TFT_2$, such that the organic light-emitting diode 104 can ensure the images to be displayed at correct grey levels. When the switching transistor $TFT_1$ is turned off, the voltage of the second gate $G_2$ can be maintained by the storage capacitor $C_{st}$, such that the driving current continuously passes through the driving transistor $TFT_2$ and the organic light-emitting diode 104.

When a high voltage is input to the first scan line $SL_{n-1}$, the pre-discharge transistor $TFT_3$ connected to the first scan line $SL_{n-1}$ is turned on. Here, charges stored in the storage capacitor $C_{st}$ are released by the pre-discharge transistor $TFT_3$ and output from the metal pre-discharge conductive layer 102, so as to avoid offset of the threshold voltage $V_{th}$ of the transistor $TFT_2$.

FIG. 2A is a schematic top view of a conventional pixel array layout. FIG. 2B is a partial enlarged view of an area A of the conventional pixel array layout 200 depicted in FIG. 2A. Referring to FIGS. 2A and 2B, the conventional pixel array layout 200 includes a substrate 202, a plurality of scan lines SL disposed on the substrate 202, a plurality of data lines DL disposed on the substrate 202, a plurality of pixel units 204 disposed on the substrate 202, and a metal pre-discharge conductive layer 102. Here, each of the pixel units 204 includes a pixel electrode P and a driving circuit 100. The metal pre-discharge conductive layer 102 is grounded or coupled to a negative voltage and crosses over a plurality of pixel units 204, so as to electrically connect the pre-discharge transistor $TFT_3$ (shown in FIG. 1) disposed in each of the pixel units 204.

SUMMARY OF THE INVENTION

In one exemplary embodiment, the present disclosure is related to a pixel array layout having a pre-discharge conductive layer.

Embodiments disclosed herein may provide a pixel array layout. The pixel array layout including a substrate, a plurality of scan lines disposed on the substrate, a plurality of data lines disposed on the substrate, a plurality of pixel units disposed on the substrate, and a pre-discharge conductive layer is provided. Each of the pixel units is electrically connected to one of the scan lines and one of the data lines correspondingly, and each of the pixel units includes a driving circuit and a pixel electrode electrically connected to the driving circuit. The pre-discharge conductive layer is electrically connected to the driving circuit and extends to an area between two adjacent pixel electrodes from an edge of the substrate, and the pre-discharge conductive layer and the pixel electrodes do not overlap.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

Figure 3A:
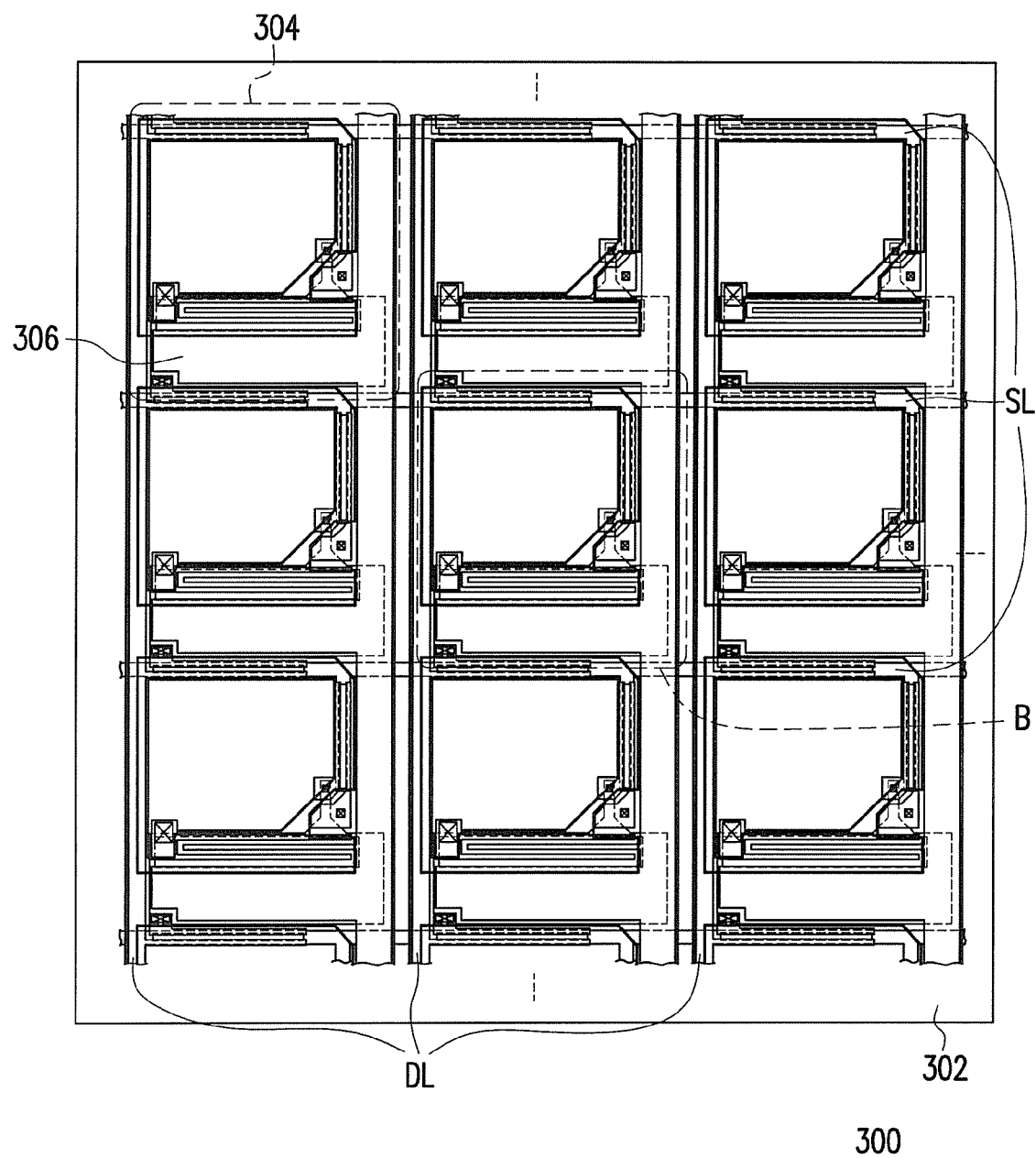
FIG. 3A is a schematic top view of a pixel array layout according to a first embodiment of the present invention.
Figure 3B:
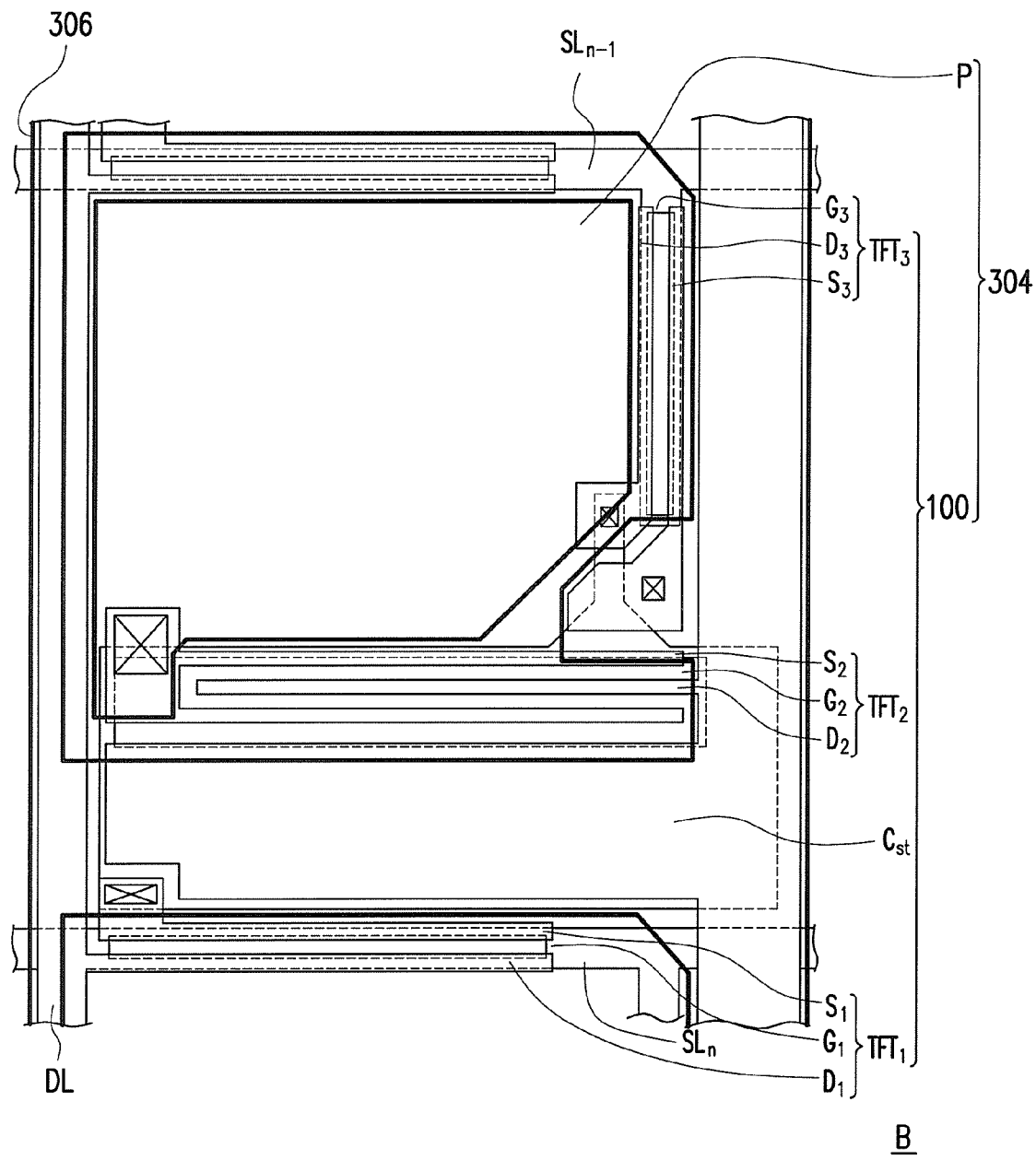
FIG. 3B is a schematic partial enlarged view of an area B of the pixel array layout 300 depicted in FIG. 3A.

FIG. 3A is a schematic top view of a pixel array layout according to a first embodiment of the present invention. FIG. 3B is a partial enlarged view of an area B of the pixel array layout 300 depicted in FIG. 3A. Referring to FIGS. 3A and 3B, the pixel array layout 300 of the present embodiment includes a substrate 302, a plurality of scan lines SL disposed on the substrate 302, a plurality of data lines DL disposed on the substrate 302, a plurality of pixel units 304 disposed on the substrate 302, and a pre-discharge conductive layer 306. Each of the pixel units 304 is electrically connected to one of the scan lines SL and one of the data lines DL correspondingly.

As shown in FIG. 3B, each of the pixel units 304 of the present embodiment includes a pixel electrode P and a driving circuit 100. Here, the driving circuit 100 depicted in FIG. 3B has the same circuit structure as that depicted in FIG. 1, for example. The pixel electrodes P of the pixel units 304 and the pre-discharge conductive layer 306 are electrically connected to the driving circuit 100. The pre-discharge conductive layer 306 extends from an area between two of the pixel electrodes P adjacent to each other from an edge of the substrate 302, and the pre-discharge conductive layer 306 and the pixel electrodes P do not overlap. Besides, in the present embodiment, the storage capacitor $C_{st}$ in the driving circuit 100 is, for example, located below the pre-discharge conductive layer 306. Note that the fabricating process of the pixel units 304 can be modified, for example, the film layers of the organic light-emitting diode 104 may be evaporated sequentially onto the substrate 302 in a reverse order, and the detailed circuit structure of the organic light-emitting diode 104 is indicated in FIG. 7.

Figure 1:
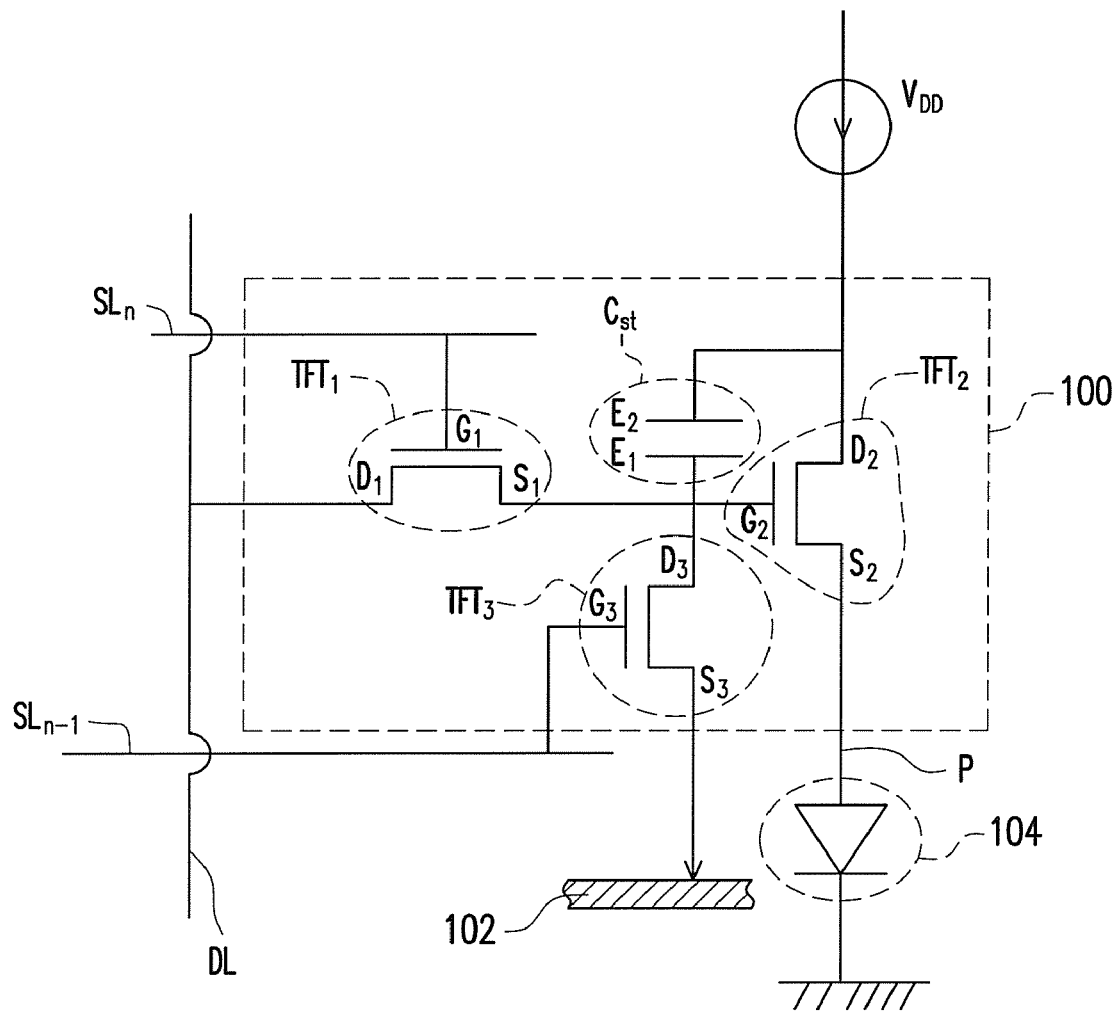
FIG. 1 is a schematic view of a conventional driving circuit having a 3T1C structure.
Figure 2A:
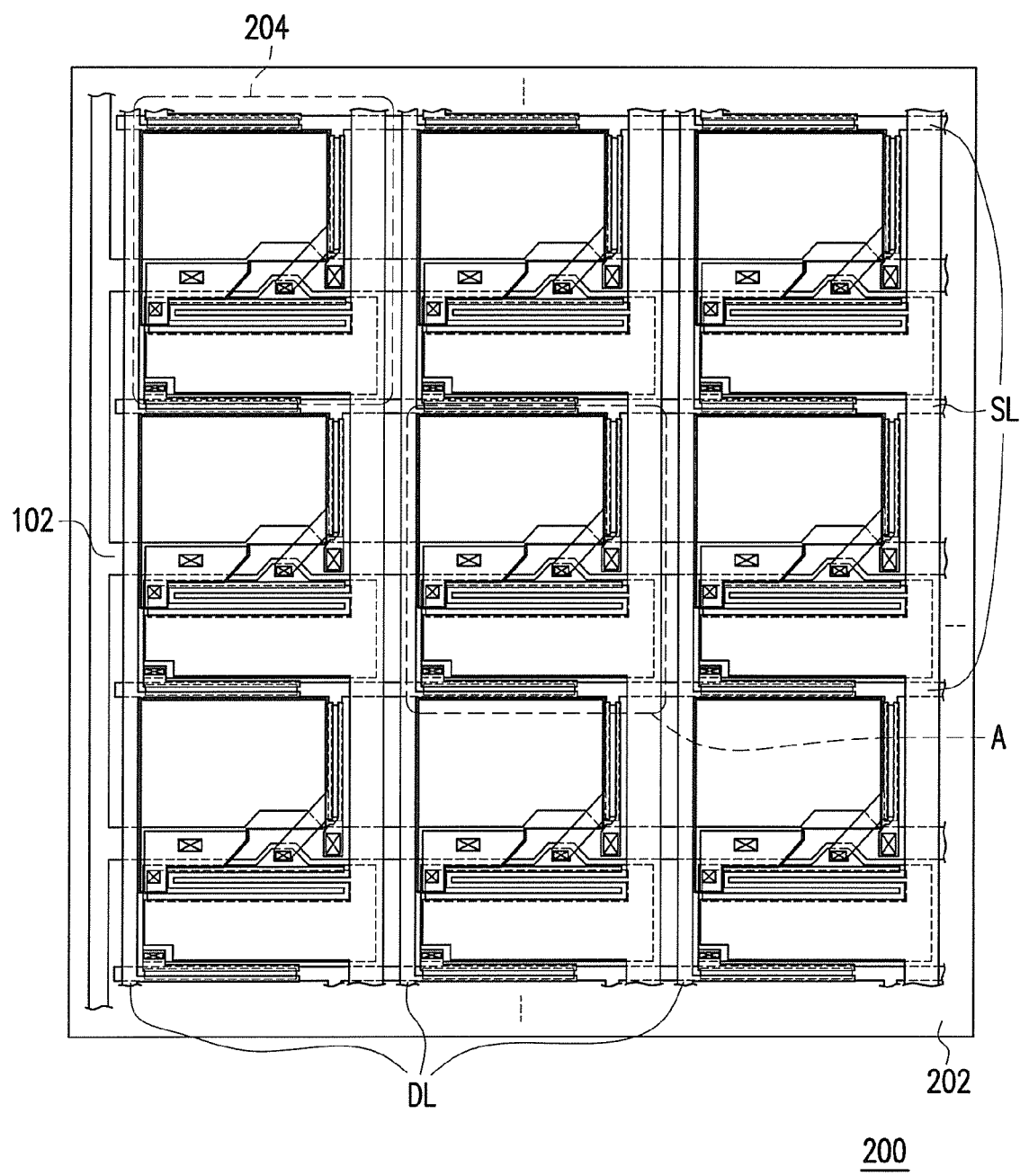
FIG. 2A is a schematic top view of a conventional pixel array layout.
Figure 2B:
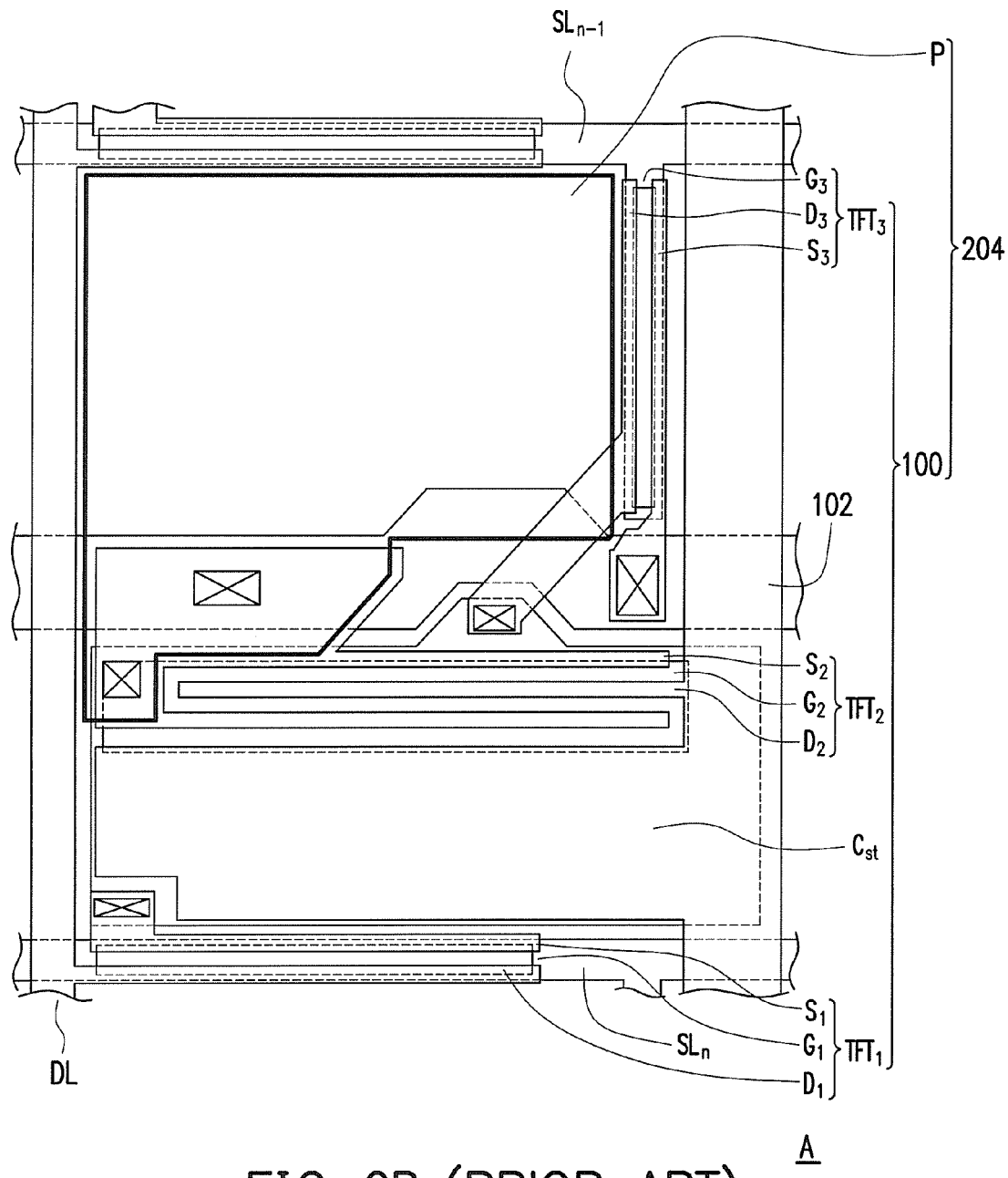
FIG. 2B is a partial enlarged view of an area A depicted in FIG. 1.
Figure 7:
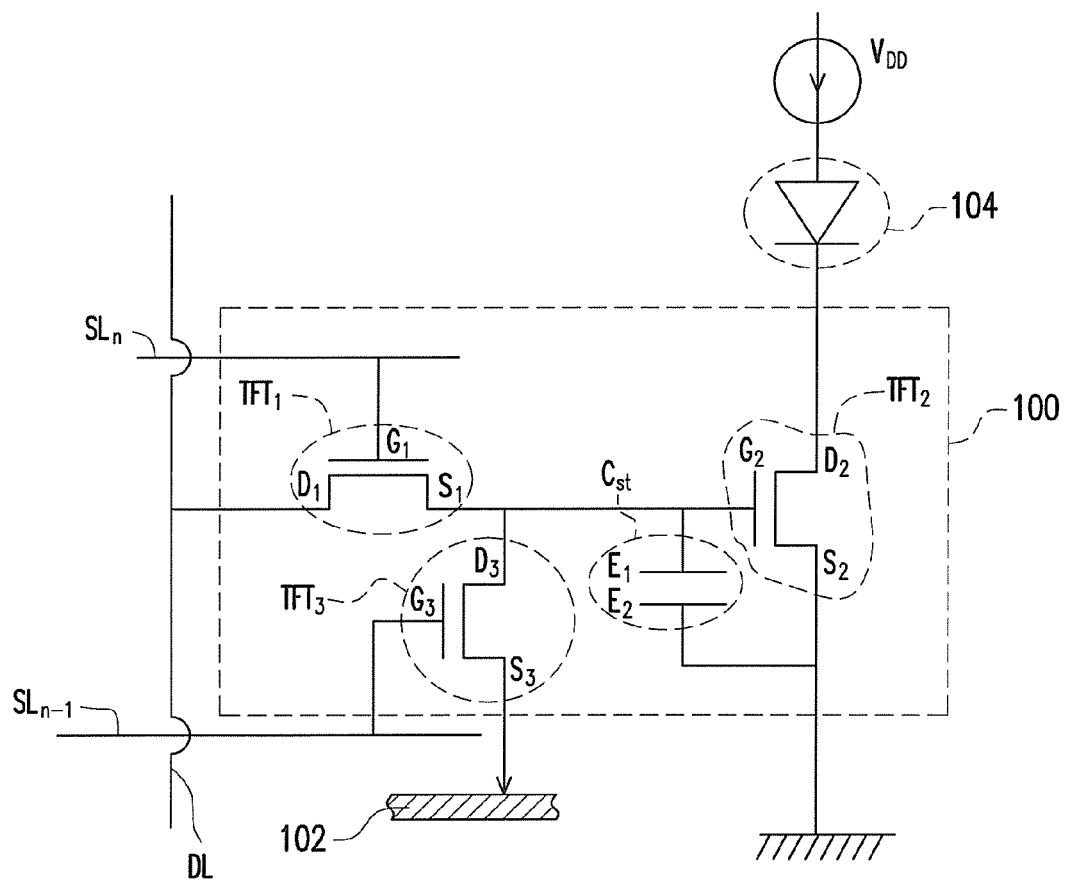
FIG. 7 is a schematic view of a driving circuit having the 3T1C structure according to another embodiment of the present invention.

FIG. 7 is a schematic view of a driving circuit having the 3T1C structure according to another embodiment of the present invention. Referring to FIG. 7 together with FIG. 1, as clearly shown in FIG. 7, when the film layers of the organic light-emitting diode 104 are evaporated onto the substrate 302 in a reverse order, the second drain $D_2$ of the driving transistor $TFT_2$ indicated in FIG. 1 is electrically connected to the organic light-emitting diode 104, and the second source $S_2$ is grounded. In addition, according to other embodiments, the number of the pre-discharge transistors $TFT_3$ can be plural instead of being singular. Moreover, the third gates $G_3$ of the pre-discharge transistors $TFT_3$ are electrically connected to several second scan lines $SL_{n-1}$, and the third sources $S_3$ are also electrically connected to the pre-discharge conductive layer 306.

Referring to FIG. 3B, it is clearly indicated that the pre-discharge conductive layer 306 can be a transparent pre-discharge conductive layer and can be fabricated together with the pixel electrodes P. The transparent pre-discharge conductive layer 306 and the pixel electrodes P are formed in the same conductive layer. Hence, in comparison with the conventional pixel units 204, the pixel units 304 of the present embodiment have a relatively high aperture ratio without performing additional manufacturing steps. For instance, the transparent pre-discharge conductive layer 306 can be made of a transparent conductive material, such as indium tin oxide (ITO), indium zinc oxide (IZO), and so on. Based on the above, when the pre-discharge conductive layer 306 and the pixel electrodes P are made of the same transparent conductive material, the pre-discharge conductive layer 306 and the pixel electrodes P can be patterned by performing a patterning process on the same film layer according to the present embodiment, such that the manufacturing costs can be reduced. As such, fabrication of the pixel array layout in the present embodiment is compatible with the existing manufacturing process.

It should be noted that the pre-discharge conductive layer 306 of the present embodiment can also be made of conductors having favorable conductivity, such as metal, alloy, and so on. The material of the pre-discharge conductive layer 306 is not limited in the present invention.

Figure 4:
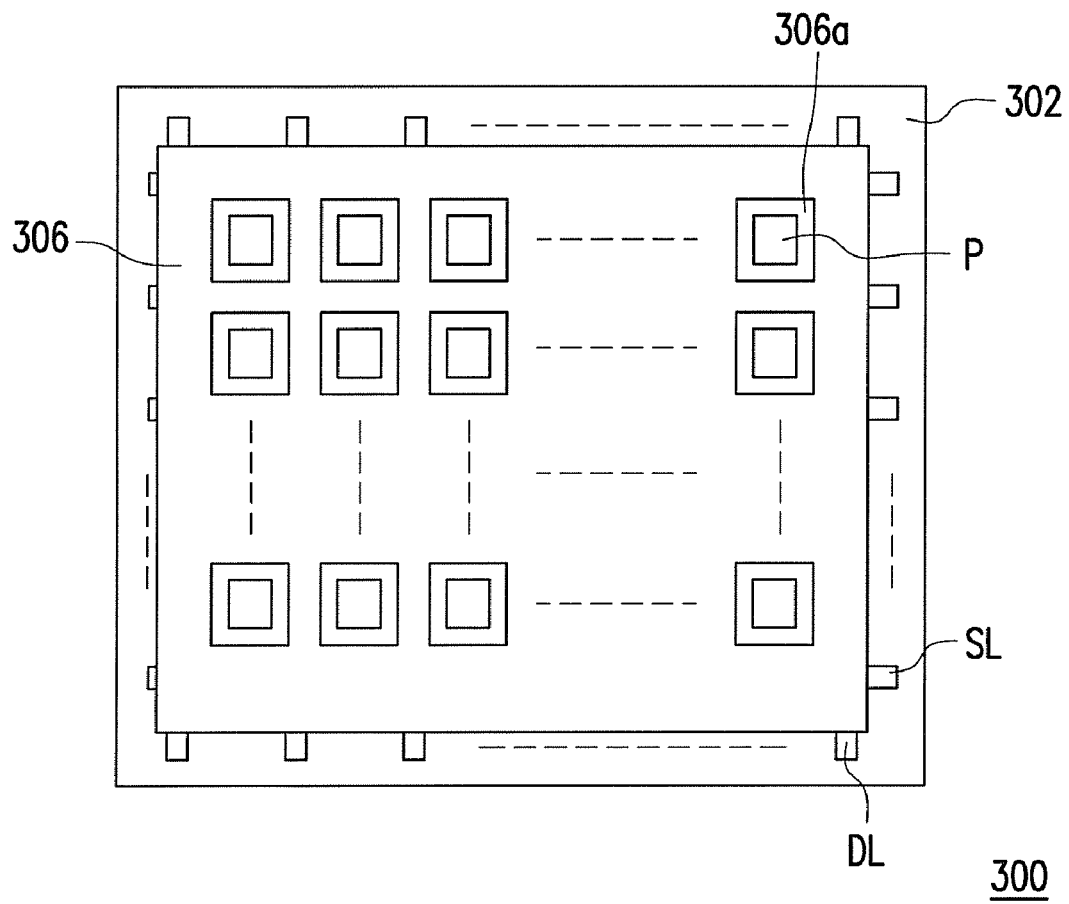
FIG. 4 is a schematic top view of the pixel array layout according to the first embodiment of the present invention.

FIG. 4 is a schematic top view of the pixel array layout according to the first embodiment of the present invention. As shown in FIG. 4, according to the present embodiment, the pre-discharge conductive layer 306 is a meshed conductive pattern having a plurality of first openings 306a, and each of the first openings 306a respectively exposes one of the pixel electrodes P.

Second Embodiment

In the following embodiments and figures, identical or similar reference numbers stand for identical or similar elements for the sake of simple illustration.

Figure 5A:
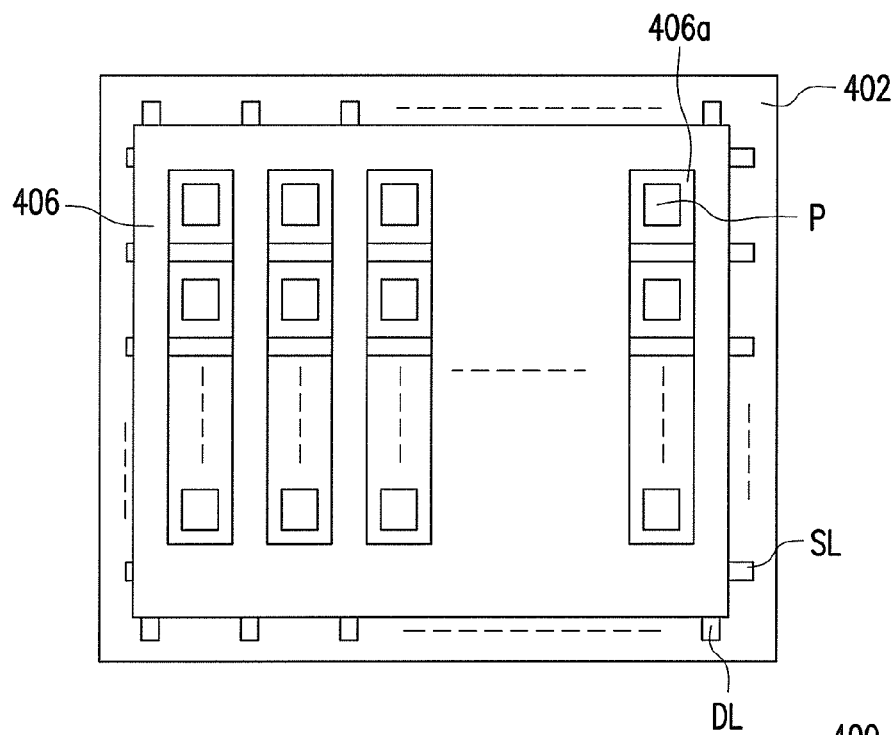
FIGS. 5A and 5B are schematic top views of a pixel array layout according to a second embodiment of the present invention.
Figure 5B:
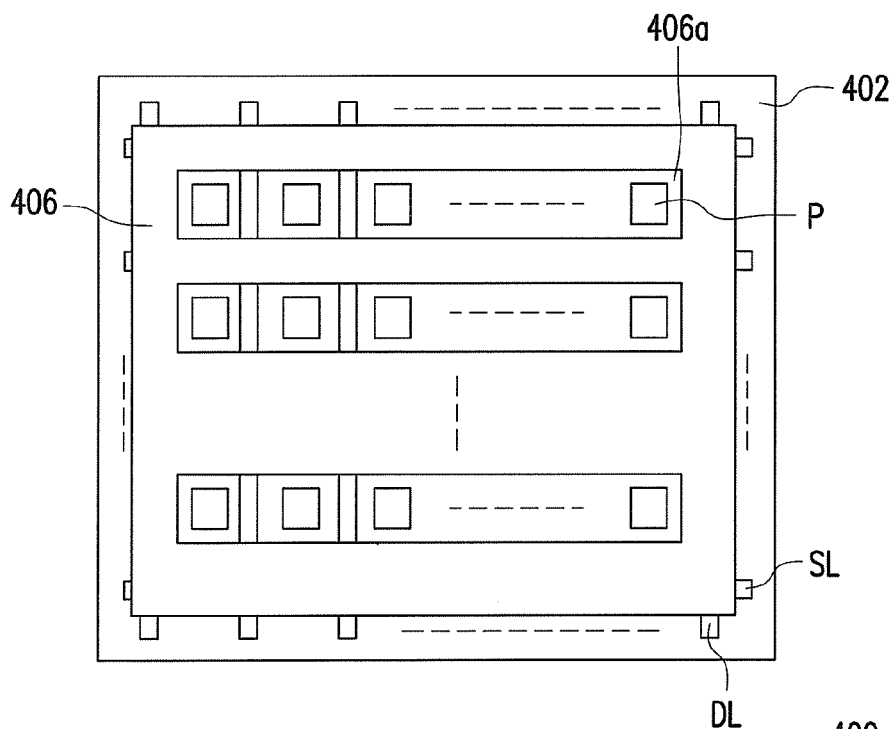

FIGS. 5A and 5B are schematic top views of a pixel array layout according to a second embodiment of the present invention. Referring to FIGS. 5A and 5B, the pixel array layout 400 of the present embodiment is similar to the pixel array layout 300 of the first embodiment, while the main difference therebetween lies in that a pre-discharge conductive layer 406 of the second embodiment is a grid pattern having a plurality of second openings 406a. Each of the second openings 406a respectively exposes a plurality of pixel electrodes P. As indicated in FIG. 5A, an extending direction of the second openings 406a is substantially parallel to an extending direction of the data lines DL, and an extending direction of the second openings 406a as shown in FIG. 5B is substantially parallel to an extending direction of the scan lines SL.

Third Embodiment

Figure 6A:
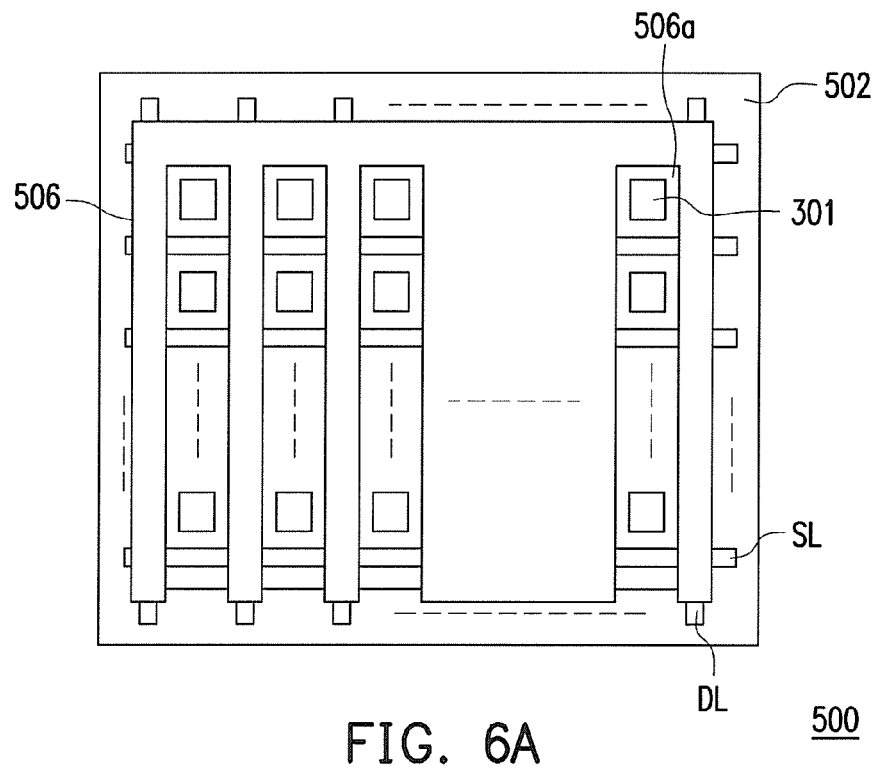
FIGS. 6A and 6B are schematic top views of a pixel array layout according to a third embodiment of the present invention.
Figure 6B:
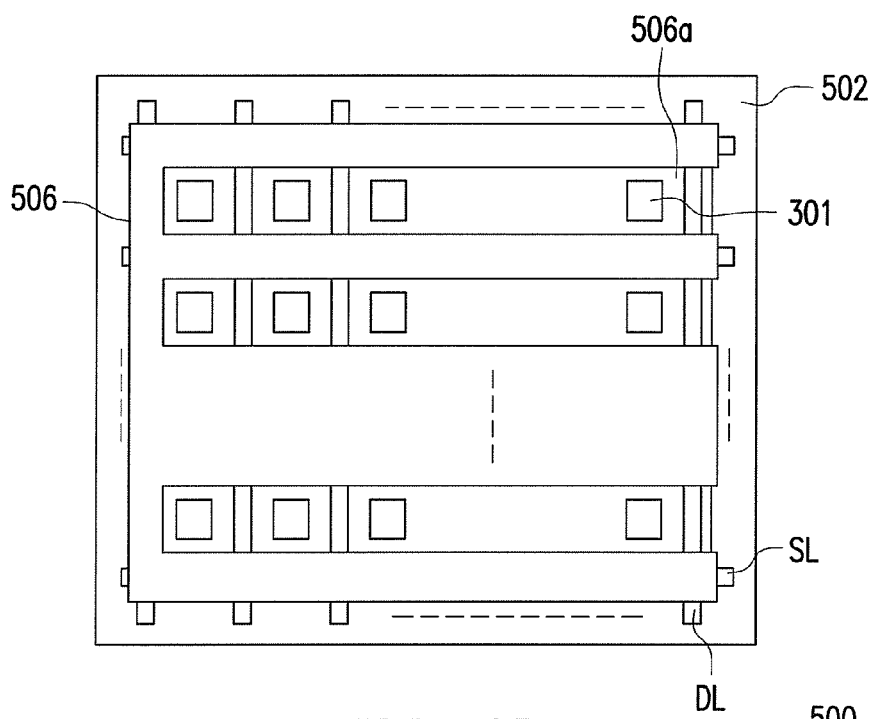

FIGS. 6A and 6B are schematic top views of a pixel array layout according to a third embodiment of the present invention. Referring to FIGS. 6A and 6B, the pixel array layout 500 of the present embodiment is similar to the pixel array layout 300 of the first embodiment, while the main difference therebetween lies in that a pre-discharge conductive layer 506 of the third embodiment is a finger-shaped pattern having a plurality of notches 506a. Each of the notches 506a respectively exposes a plurality of pixel electrodes P. As indicated in FIG. 6A, an extending direction of the notches 506a is substantially parallel to an extending direction of the data lines DL, and an extending direction of the notches 506a as shown in FIG. 6B is substantially parallel to an extending direction of the scan lines SL.

In one exemplary embodiment, the pre-discharge conductive layer that does not overlap the pixel electrodes is used in the pixel array layout, so as to increase the aperture ratio.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel array layout, comprising:
   a substrate;
   a plurality of scan lines disposed on the substrate;
   a plurality of data lines disposed on the substrate;
   a plurality of pixel units disposed on the substrate, wherein each of the plurality of pixel units is electrically connected to at least one of the scan lines and one of the data lines correspondingly, and each of the plurality of pixel units respectively has a driving circuit and a pixel electrode electrically connected to the driving circuit; and
   a pre-discharge conductive layer electrically connected to the driving circuit, wherein the pre-discharge conductive layer extends to an area between two of the pixel electrodes adjacent to each other from an edge of the substrate, and the pre-discharge conductive layer and the pixel electrodes do not overlap.

2. The pixel array layout as claimed in claim 1, wherein each of the plurality of pixel units comprises:
   a switching transistor having a first gate, a first source, and a first drain, wherein the first gate is electrically connected to one of the plurality of scan lines, and the first drain is electrically connected to one of the plurality of data lines;
   a driving transistor having a second gate, a second source, and a second drain, wherein the second drain is electrically connected to a voltage or a current source, and the second source is electrically connected to the pixel electrode;
   at least a pre-discharge transistor having at least one third gate, at least one third source, and at least one third drain, wherein the at least one third gate and at least one preceding scan line are electrically connected, and the at least one third source and the pre-discharge conductive layer are electrically connected; and
   a storage capacitor having a first electrode and a second electrode, wherein the first electrode, the first source, the second gate, and the at least one third drain are electrically connected, and the second electrode is electrically connected to the voltage or the current source.

3. The pixel array layout as claimed in claim 1, wherein each of the plurality of pixel units comprises:
   a switching transistor having a first gate, a first source, and a first drain, wherein the first gate is electrically connected to at least one of the plurality of scan lines, and the first drain is electrically connected to one of the plurality of data lines;
   a driving transistor having a second gate, a second source, and a second drain, wherein the second drain is electrically connected to the pixel electrode, and the second source is grounded;
   at least a pre-discharge transistor having at least one third gate, at least one third source, and a third drain, wherein the at least one third gate and at least one preceding scan line are electrically connected, and the at least one third source and the pre-discharge conductive layer are electrically connected; and
   a storage capacitor having a first electrode and a second electrode, wherein the first electrode, the first source, the second gate, and the at least one third drain are electrically connected, and the second electrode is grounded.

4. The pixel array layout as claimed in claim 2, wherein the storage capacitors of the plurality of pixel units are located below the pre-discharge conductive layer.

5. The pixel array layout as claimed in claim 3, wherein the storage capacitors of the plurality of pixel units are located below the pre-discharge conductive layer.

6. The pixel array layout as claimed in claim 1, wherein the pre-discharge conductive layer is a meshed conductive pattern.

7. The pixel array layout as claimed in claim 1, wherein the pre-discharge conductive layer is a meshed conductive pattern having a plurality of first openings, and each of the plurality of first openings respectively exposes one of the pixel electrodes.

8. The pixel array layout as claimed in claim 1, wherein the pre-discharge conductive layer is a grid pattern having a plurality of second openings, and each of the plurality of second openings respectively exposes more than one of the pixel electrodes.

9. The pixel array layout as claimed in claim 8, wherein an extending direction of the plurality of second openings is substantially parallel to an extending direction of the plurality of scan lines.

10. The pixel array layout as claimed in claim 8, wherein an extending direction of the plurality of second openings is substantially parallel to an extending direction of the plurality of data lines.

11. The pixel array layout as claimed in claim 1, wherein the pre-discharge conductive layer is a finger-shaped pattern having a plurality of notches, and each of the plurality of notches respectively exposes more than one of the pixel electrodes.

12. The pixel array layout as claimed in claim 11, wherein an extending direction of the plurality of notches is substantially parallel to an extending direction of the plurality of scan lines.

13. The pixel array layout as claimed in claim 11, wherein an extending direction of the plurality of notches is substantially parallel to an extending direction of the plurality of data lines.

14. The pixel array layout as claimed in claim 1, wherein a material of the pixel electrodes is the same as a material of the pre-discharge conductive layer.

15. The pixel array layout as claimed in claim 1, wherein the pre-discharge conductive layer is a transparent pre-discharge conductive layer.

16. The pixel array layout as claimed in claim 15, wherein the pixel electrodes and the transparent pre-discharge conductive layer are formed by patterning a same film layer.

17. The pixel array layout as claimed in claim 1, wherein a material of the pre-discharge conductive layer is the same as a material of the plurality of scan lines or a material of the plurality of data lines.

* * * * *